United States Patent
Adjiwibawa et al.

(10) Patent No.: US 10,715,168 B2
(45) Date of Patent: Jul. 14, 2020

(54) SYSTEMS AND METHODS FOR DRIVING AN ELECTRONIC DISPLAY USING A RAMP DAC

(71) Applicant: Apple Inc., Cupertino, CA (US)

(72) Inventors: Adam Adjiwibawa, Cupertino, CA (US); David W. Lum, Cupertino, CA (US); Wonjae Choi, Cupertino, CA (US); Hynwoo Nho, Stanford, CA (US); Hopil Bae, Sunnyvale, CA (US); Injae Hwang, Tokyo (JP); Bryce T. Bradford, Cupertino, CA (US); Jie Won Ryu, Sunnyvale, CA (US); Hung Sheng Lin, San Jose, CA (US)

(73) Assignee: Apple Inc., Cupertino, CA (US)

( * ) Notice: Subject to any disclaimer, the term of this patent is extended or adjusted under 35 U.S.C. 154(b) by 73 days.

(21) Appl. No.: 15/600,356

(22) Filed: May 19, 2017

(65) Prior Publication Data

US 2018/0337687 A1    Nov. 22, 2018

(51) Int. Cl.
*H03H 11/26* (2006.01)
*H03M 1/66* (2006.01)
*G09G 3/20* (2006.01)

(52) U.S. Cl.
CPC .......... *H03M 1/662* (2013.01); *G09G 3/2088* (2013.01); *G09G 2310/027* (2013.01); *G09G 2310/0259* (2013.01); *G09G 2310/066* (2013.01)

(58) Field of Classification Search
CPC ............................ G09G 3/2088; H03M 1/662
USPC ........................................................ 327/276
See application file for complete search history.

(56) References Cited

U.S. PATENT DOCUMENTS

2008/0238953 A1\* 10/2008 Ogura .................. G09G 3/3275
                                                                       345/697
2018/0061359 A1\* 3/2018 Shiibayashi ......... G09G 3/3648

\* cited by examiner

*Primary Examiner* — Metasebia T Retebo
(74) *Attorney, Agent, or Firm* — Fletcher Yoder, P.C.

(57) ABSTRACT

A display device may include rows of pixels that displays image data on a display, data lines coupled to the rows of pixels, and a digital-to-analog converter (DAC) that outputs a ramp voltage signal including a data voltage to be depicted on a first pixel of the rows of pixels. The display device may also include a capacitor that receives the ramp voltage signal via the DAC and a circuit that sends a control signal to a circuit component that causes the DAC to couple to the capacitor via one of the data lines for a duration of time that comprises a first time when the ramp voltage signal is below the data voltage and a second time when the ramp voltage signal is approximately equal to the data voltage. The capacitor is coupled to the DAC when the ramp voltage signal is greater than zero.

16 Claims, 11 Drawing Sheets

SYSTEMS AND METHODS FOR DRIVING AN ELECTRONIC DISPLAY USING A RAMP DAC

BACKGROUND

This disclosure relates to efficiently driving display panels to depict image data. More specifically, the current disclosure provides systems and methods that provide image data to pixels of a display panel using ramp digital-to-analog converter circuitry.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic devices include electronic displays that employ pixels and pixel circuits to depict image data. Display drivers are used to provide gray level values to each pixel circuit of the display, such that the respective pixel depicts a corresponding brightness level. Generally, the display drivers may provide voltage levels to each pixel circuit via a data line that is coupled to the respective pixel circuit. As display panel refresh rates continue to improve and increase, providing voltage levels for every frame of image data via the data lines may involve an increasing amount of power.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

To improve the power efficiency of a display driver, the display driver may use a ramp digital-to-analog converter (DAC) circuit to provide voltages to various pixels coupled to a number (e.g., three) of data lines that extends across a display panel. The ramp DAC circuit may output a number of voltages according to a linear or non-linear function. As the ramp DAC circuit outputs the voltages according to the ramp function, the display driver may include a circuit component (e.g., multiplexer) that controls when the voltage output of the ramp DAC circuit is coupled to a respective data line and thus to respective pixel circuit. As such, the circuit component may couple a respective pixel circuit (e.g., capacitor) to the ramp DAC circuit while the ramp DAC circuit outputs a voltage until the output voltage reaches a voltage level as specified by input image data. After the ramp DAC circuit reaches the desired voltage level, the circuit component may disconnect the ramp DAC circuit from the respective data line. During the subsequent frame of image data, the circuit component may again couple a respective pixel circuit (e.g., capacitor) to the ramp DAC circuit while the ramp DAC circuit outputs a voltage until the output voltage reaches a voltage level as specified by input image data. As such, the respective pixel circuit may first be discharged and coupled to the ramp DAC circuit again until the voltage output of the ramp DAC circuit reaches a specified voltage level. The continuous discharging and charging of the pixel circuit may involve a high amount of dynamic power losses.

To reduce dynamic power loss due to continuously charging and discharging a capacitor of a respective pixel circuit, presently disclosed systems may couple the ramp DAC circuit output for a short duration of time just before the voltage output of the ramp DAC circuit reaches a voltage level specified for the respective pixel according to the corresponding frame of image data. As a result, the capacitor of the respective pixel circuit may avoid dynamic power losses due to regular discharging of the capacitor between image frames.

In certain embodiments, multiple ramp DAC circuits may be employed by a display driver to provide increased flexibility in providing a voltage to a respective data line. That is, based on the image data for a number of pixels, the display driver may identify a particular ramp DAC circuit output to couple to a respective data line to further improve the power efficiency of the display. Additional details with regard to how a ramp DAC circuit may be employed in providing pixel data (e.g., data voltage) to pixel circuits will be discussed below with reference to FIGS. 1-18.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

This disclosure relates to controlling the timing in which a ramp digital-to-analog converter (DAC) circuit output is coupled to a data line in a display panel to provide a data voltage (e.g., pixel voltage) to a respective pixel circuit. In certain embodiments, a display driver circuit may use a circuit component (e.g., multiplexer) to couple the output of the ramp DAC circuit for a brief amount of time (e.g., less than an amount of time that corresponds to a frame of image data) during which the ramp DAC circuit is outputting a voltage level that corresponds to a voltage specified by image data. By coupling the ramp DAC circuit to the data line for the period of time that begins just before the output of the ramp DAC circuit reaches a specified value, the display driver may reduce an amount of dynamic power used by the respective pixel circuit by avoiding discharging a corresponding capacitor between each frame of image data. Additional details with regard to how a ramp DAC circuit may be employed in providing pixel data (e.g., data voltage) to pixel circuits will be discussed below with reference to FIGS. 1-18.

Figure 1:
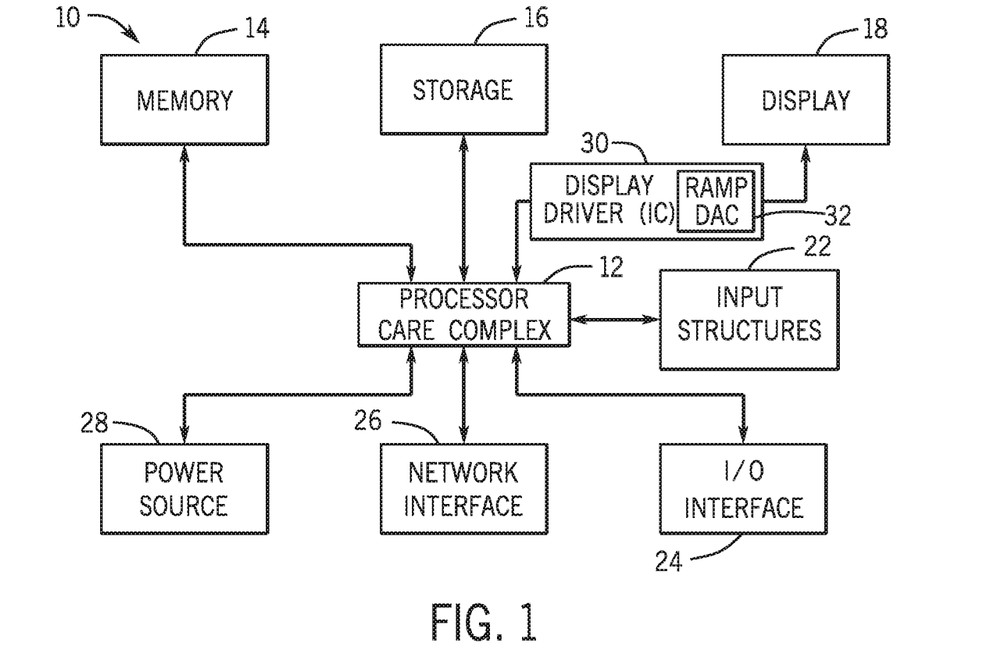
FIG. 1 is a schematic block diagram of an electronic device including a display, in accordance with an embodiment.

By way of introduction, FIG. 1 includes an electronic device 10 according to an embodiment of the present disclosure may include, among other things, a processor core complex 12 having one or more processor(s), memory 14, nonvolatile storage 16, a display 18 input structures 22, an input/output (I/O) interface 24, network interfaces 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
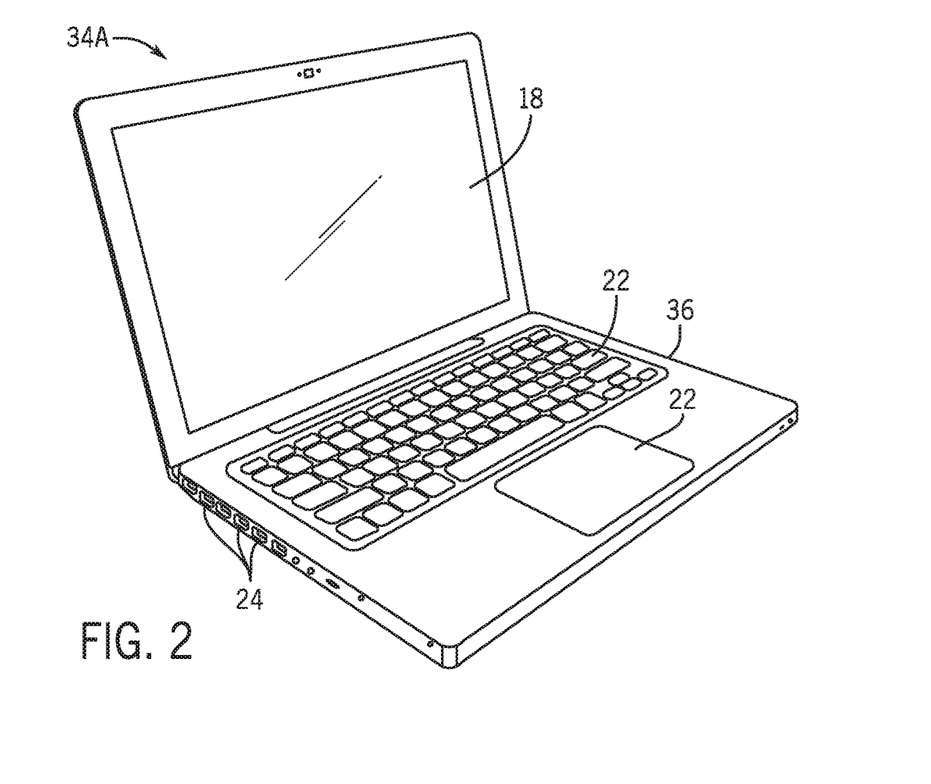
FIG. 2 is a perspective view of a notebook computer representing an embodiment of the electronic device of FIG. 1, in accordance with an embodiment.
Figure 3:
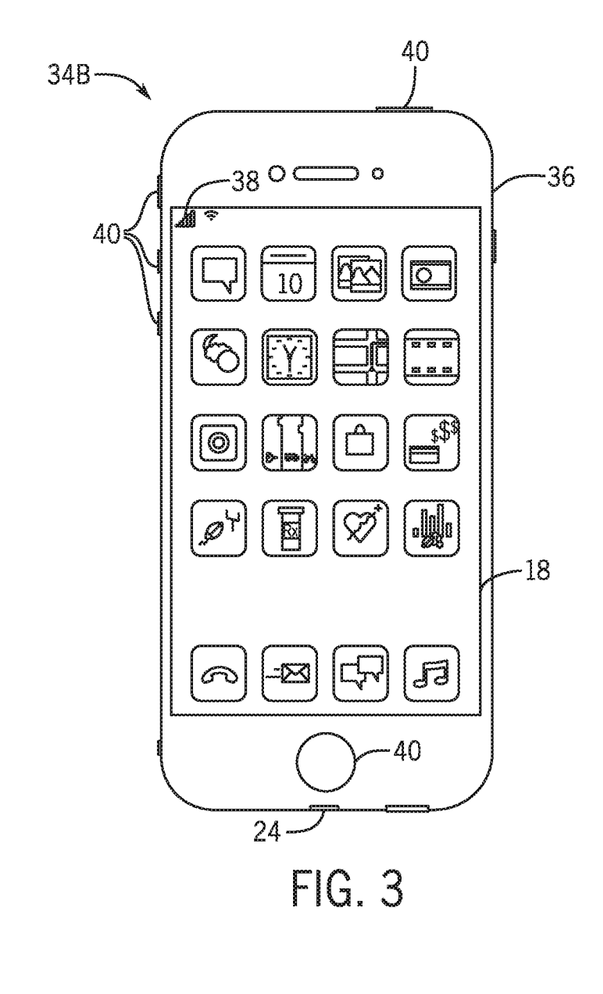
FIG. 3 is a front view of a hand-held device representing another embodiment of the electronic device of FIG. 1, in accordance with an embodiment.
Figure 4:
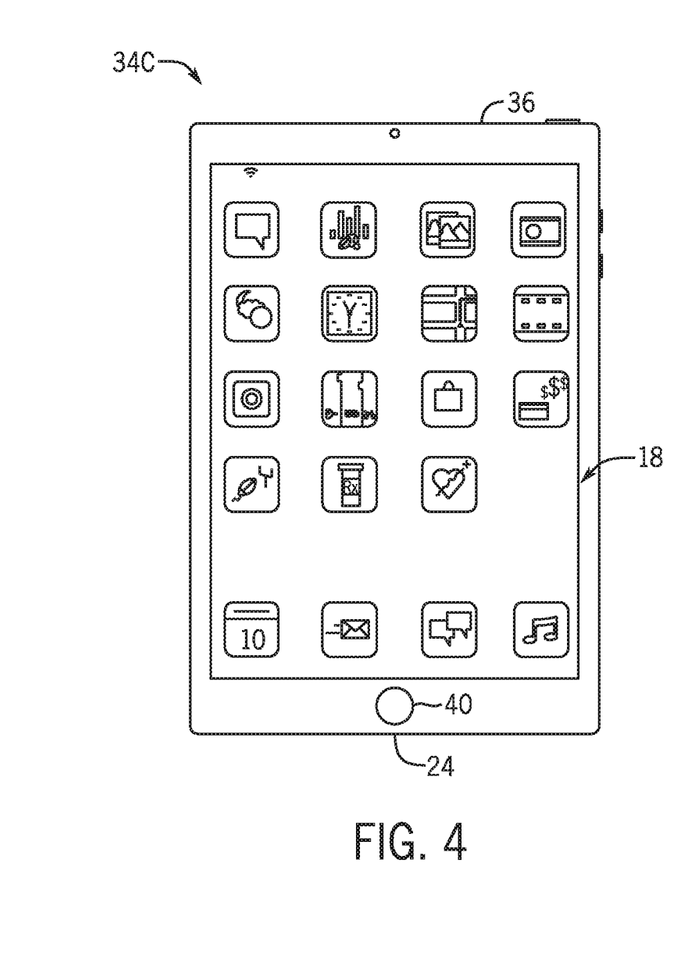
FIG. 4 is a front view of another hand-held device representing another embodiment of the electronic device of FIG. 1, in accordance with an embodiment.
Figure 5:
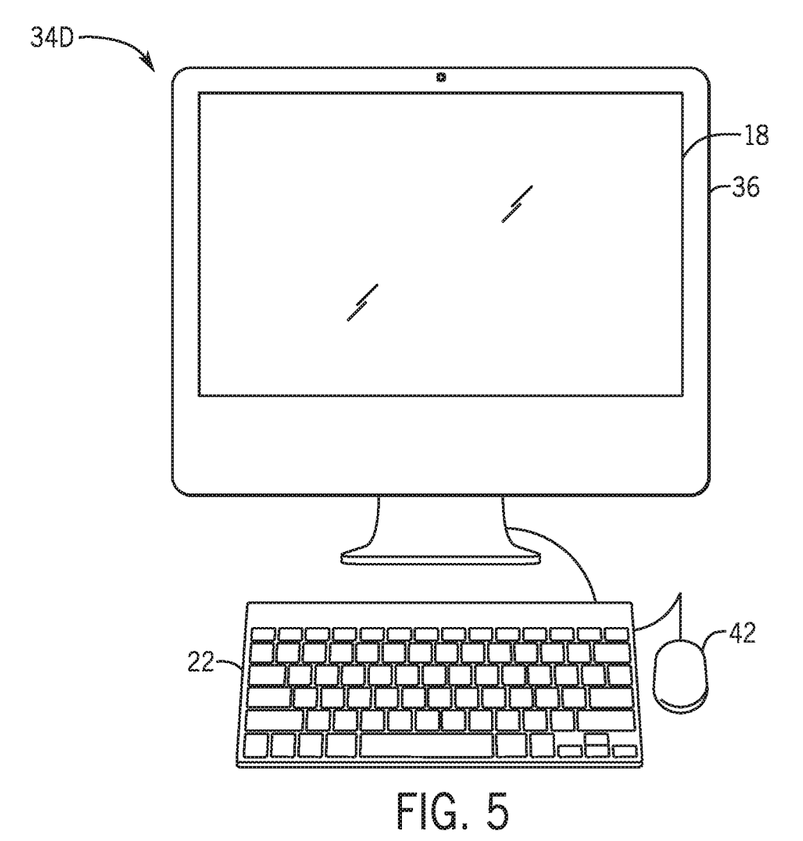
FIG. 5 is a front view of a desktop computer representing another embodiment of the electronic device of FIG. 1, in accordance with an embodiment.

By way of example, the electronic device 10 may represent a block diagram of the notebook computer depicted in FIG. 2, the handheld device depicted in FIG. 3, the desktop computer depicted in FIG. 4, the wearable electronic device depicted in FIG. 5, or similar devices. It should be noted that the processor core complex 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor core complex 12 and/or other data processing circuitry may be operably coupled with the memory 14 and the nonvolatile storage 16 to perform various algorithms. Such programs or instructions executed by the processor core complex 12 may be stored in any suitable article of manufacture that may include one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions that may be executed by the processor core complex 12 to enable the electronic device 10 to provide various functionalities.

As will be discussed further below, the display 18 may include pixels such as organic light emitting diodes (OLEDs), micro-light-emitting-diodes (µ—LEDs), or any other light emitting diodes (LEDs). In addition, the display 18 may include any other suitable display device such as a liquid crystal display (LCD) and the like. Further, the display 18 is not limited to a particular pixel type, as the circuitry and methods disclosed herein may apply to any pixel type. Accordingly, while particular pixel structures may be illustrated in the present disclosure, the present disclosure may relate to a broad range of lighting components and/or pixel circuits within display devices.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interfaces 26. The network interfaces 26 may include, for example, interfaces for a personal area network (PAN), such as a Bluetooth network, for a local area network (LAN) or wireless local area network (WLAN), such as an 802.11x Wi-Fi network, and/or for a wide area network (WAN), such as a $3^{rd}$ generation (3G) cellular network, $4^{th}$ generation (4G) cellular network, or long term evolution (LTE) cellular network. The network interface 26 may also include interfaces for, for example, broadband fixed wireless access networks (WiMAX), mobile broadband Wireless networks (mobile WiMAX), asynchronous digital subscriber lines (e.g., 15SL, VDSL), digital video broadcasting-terrestrial (DVB-T) and its extension DVB Handheld (DVB-H), ultra Wideband (UWB), alternating current (14) power lines, and so forth.

In certain embodiments, the electronic device 10 may include a display driver integrated circuit (IC) 30 that may receive image data from the processor core complex 12 to display via the display 18. The display driver IC 30 may receive image data and output data voltages to pixel circuits of the display 18 to coordinate the illumination of respective pixels in the display 18 based on the corresponding image data. To provide the voltages to the pixel circuits, the display driver IC 30 may employ a ramp digital-to-analog converter (DAC) circuit 32 that outputs a number of voltages according to a linear or non-linear function. In addition to the ramp DAC circuit 32, the display driver IC 30 may include a circuit component, such as a multiplexer, that may control how various data lines within the display 18 may be coupled to the ramp DAC circuit 32. Although the display driver IC 30 is depicted as being separate from the display 18, it should be noted that in some embodiments the display driver IC 30 may be disposed within the display 18. Additional details with regard to the additional circuitry of the display driver IC 30 will be discussed below with reference to FIG. 9.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 34A, is illustrated in FIG. 2 in accordance with one embodiment of the present disclosure. The depicted computer 34A may include a housing or enclosure 36, a display 18, input structures 22, and ports of an I/O interface 24. In one embodiment, the input structures 22 (such as a keyboard and/or touchpad) may be used to interact with the computer 34A, such as to start, control, or operate a GUI or applications running on computer 34A. For example, a keyboard and/or touchpad may allow a user to navigate a user interface or application interface displayed on display 18.

FIG. 3 depicts a front view of a handheld device 34B, which represents one embodiment of the electronic device 10. The handheld device 34B may represent, for example, a portable phone, a media player, a personal data organizer, a handheld game platform, or any combination of such devices. By way of example, the handheld device 34B may be a model of an iPod® or iPhone® available from Apple Inc. of Cupertino, Calif.

The handheld device 34B may include an enclosure 36 to protect interior components from physical damage and to shield them from electromagnetic interference. The enclosure 36 may surround the display 18, which may display indicator icons 38. The indicator icons 38 may indicate, among other things, a cellular signal strength, Bluetooth connection, and/or battery life. The I/O interfaces 24 may open through the enclosure 36 and may include, for example, an I/O port for a hard-wired connection for charging and/or content manipulation using a standard connector and protocol, such as the Lightning connector provided by Apple Inc., a universal service bus (USB), or other similar connector and protocol.

User input structures 40, in combination with the display 18, may allow a user to control the handheld device 34B. For example, the input structure 40 may activate or deactivate the handheld device 34B, the input structure 40 may navigate user interface to a home screen, a user-configurable application screen, and/or activate a voice-recognition feature of the handheld device 34B, the input structures 40 may provide volume control, or may toggle between vibrate and ring modes. The input structures 40 may also include a microphone may obtain a user's voice for various voice-related features, and a speaker may enable audio playback and/or certain phone capabilities. The input structures 40 may also include a headphone input may provide a connection to external speakers and/or headphones.

FIG. 4 depicts a front view of another handheld device 34C, which represents another embodiment of the electronic device 10. The handheld device 34C may represent, for example, a tablet computer, or one of various portable computing devices. By way of example, the handheld device 34C may be a tablet-sized embodiment of the electronic device 10, which may be, for example, a model of an iPad® available from Apple Inc. of Cupertino, Calif.

Turning to FIG. 5, a computer 34D may represent another embodiment of the electronic device 10 of FIG. 1. The computer 34D may be any computer, such as a desktop computer, a server, or a notebook computer, but may also be a standalone media player or video gaming machine. By way of example, the computer 30D may be an iMac®, a MacBook®, or other similar device by Apple Inc. It should be noted that the computer 34D may also represent a personal computer (PC) by another manufacturer. A similar enclosure 36 may be provided to protect and enclose internal components of the computer 34D such as the display 18. In certain embodiments, a user of the computer 34D may interact with the computer 34D using various peripheral input devices, such as the input structures 22 or mouse 42, which may connect to the computer 34D via a wired and/or wireless I/O interface 24.

Figure 6:
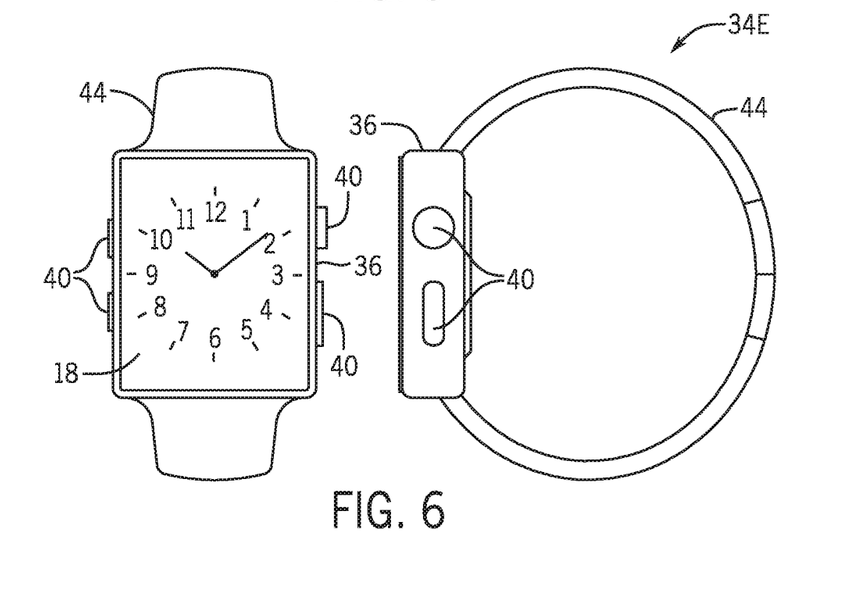
FIG. 6 is a front view of a wearable electronic device representing another embodiment of the electronic device of FIG. 1, in accordance with an embodiment.

Similarly, FIG. 6 depicts a wearable electronic device 34E representing another embodiment of the electronic device 10 of FIG. 1 that may be configured to operate using the techniques described herein. By way of example, the wearable electronic device 34E, which may include a wristband 44, may be an Apple Watch® by Apple, Inc. However, in other embodiments, the wearable electronic device 30E may include any wearable electronic device such as, for example, a wearable exercise monitoring device (e.g., pedometer, accelerometer, heart rate monitor), or other device by another manufacturer. The display 18 of the wearable electronic device 34E may include a touch screen, which may allow users to interact with a user interface of the wearable electronic device 34E.

Figure 7:
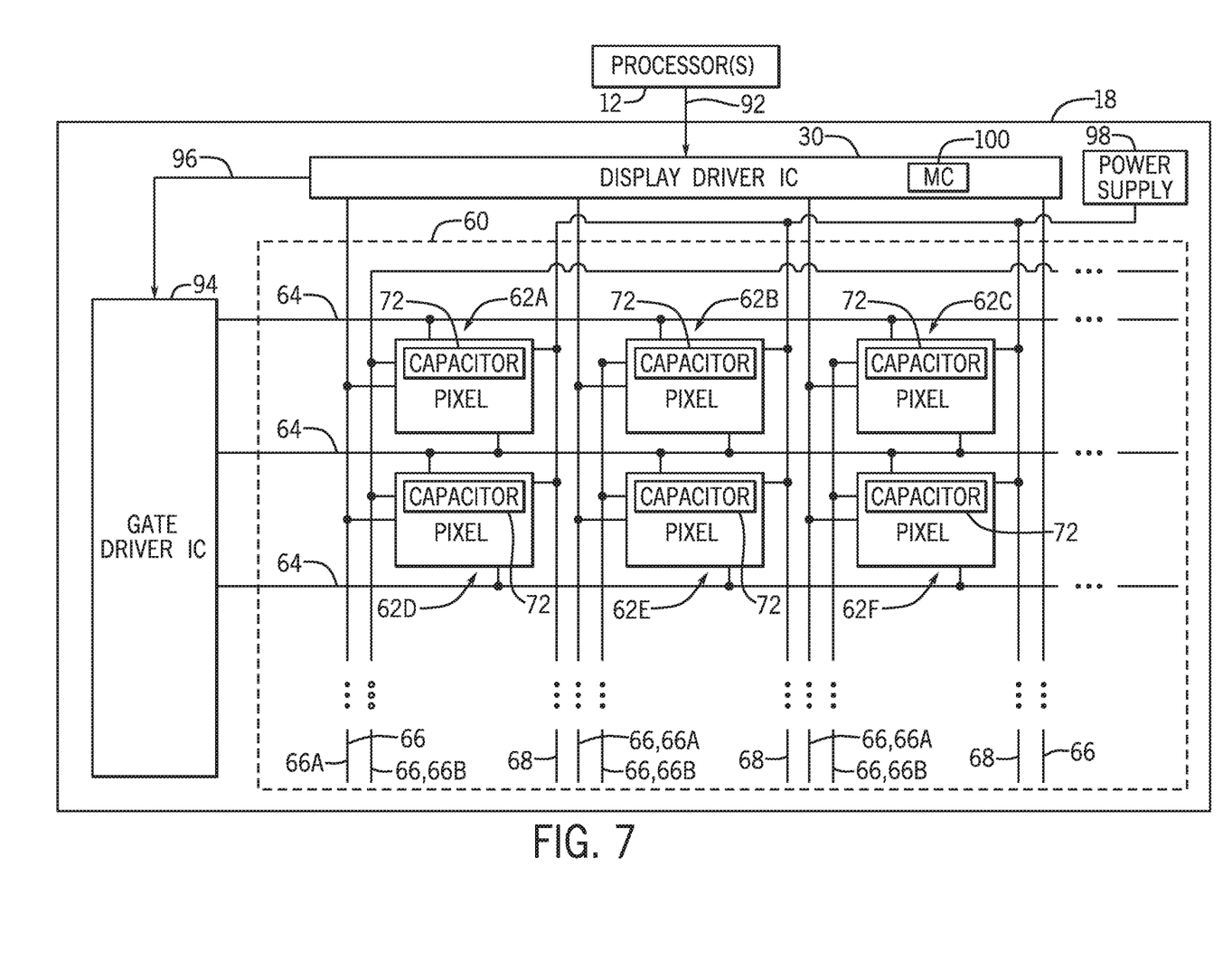
FIG. 7 is a circuit diagram illustrating a portion of a matrix of pixels of the display of FIG. 1, in accordance with an embodiment.

The display 18 for the electronic device 10 may include a matrix of pixels that contain light emitting circuitry. Accordingly, FIG. 7 illustrates a circuit diagram including a portion of a matrix of pixels of the display 18. As illustrated, the display 18 may include a display panel 60. Moreover, the display panel 60 may include multiple unit pixels 62 arranged as an array or matrix defining multiple rows and columns of the unit pixels 62 that collectively form a viewable region of the display 18 in which an image may be displayed. In such an array, each unit pixel 62 may be defined by the intersection of rows and columns, represented here by the illustrated gate lines 64 (also referred to as "scanning lines") and data lines 66 (also referred to as "source lines"), respectively. Additionally, power supply lines 68 may provide power to each of the unit pixels 62.

Although only six unit pixels 62, referred to individually by reference numbers 62a, 62b, 62c, 62d, 62e, and 62f, respectively, are shown, it should be understood that in an actual implementation, each data line 66 and gate line 64 may include hundreds or even thousands of such unit pixels 62. By way of example, in a color display panel 60 having a display resolution of 1024×768, each data line 66, which may define a column of the pixel array, may include 768 unit pixels, while each gate line 64, which may define a row of the pixel array, may include 1024 groups of unit pixels with each group including a red, blue, and green pixel, thus totaling 3072 unit pixels per gate line 64. By way of further example, the panel 60 may have a resolution of 480×320 or 960×640. In the presently illustrated example, the unit pixels 62a, 62b, and 62c may represent a group of pixels having a red pixel (62a), a blue pixel (62b), and a green pixel (62c). The group of unit pixels 62d, 62e, and 62f may be arranged in a similar manner. Additionally, in the industry, it is also common for the term "pixel" may refer to a group of adjacent different-colored pixels (e.g., a red pixel, blue pixel, and green pixel), with each of the individual colored pixels in the group being referred to as a "sub-pixel."

In certain embodiments, the display 18 also includes the display driver integrated circuit (IC) 30, which may include a chip, such as a processor or ASIC, configured to control various aspects of the display 18 and panel 60. For example, the display driver IC 30 may receive image data 92 from the processor core complex 12 and send corresponding image signals to the unit pixels 62 of the panel 60. The display driver IC 30 may also be coupled to a gate driver IC 94, which may be configured to provide/remove gate activation signals to activate/deactivate rows of unit pixels 62 via the gate lines 64. The display driver IC 30 may include a timing controller that determines and sends timing information 96 to the gate driver IC 94 to facilitate activation and deactivation of individual rows of unit pixels 62. In other embodiments, timing information may be provided to the gate driver IC 94 in some other manner (e.g., using a timing controller that is separate from the display driver IC 30). Further, while FIG. 7 depicts only a single display driver IC 30, it should be appreciated that other embodiments may utilize multiple display driver ICs 30 to provide image signals to the unit pixels 62. For example, additional embodiments may include multiple display drivers IC 30 disposed along one or more edges of the panel 60, with each display driver IC 30 being configured to control a subset of the data lines 66 and/or gate lines 64.

In operation, the display driver IC 30 receives image data 92 from the processor core complex 12 or a discrete display controller and, based on the received data, outputs signals to control the unit pixels 62. When the unit pixels 62 are controlled by display driver IC 30, circuitry within the unit pixels 62 may complete a circuit between a power supply 98 and light elements of the unit pixels 62. As such, the output signals provided to the unit pixels 62 may include data voltages that correspond to grey levels to be depicted by the corresponding pixels 62. In some embodiments, the data voltages may be coupled to capacitors 70 that may store the data voltage and provide the data voltage to the pixel 62. Additionally, to measure operating parameters of the display 18, measurement circuitry 100 may be positioned within the display driver IC 30 to read various voltage and current characteristics of the display 18, as discussed in detail below.

Figure 8:
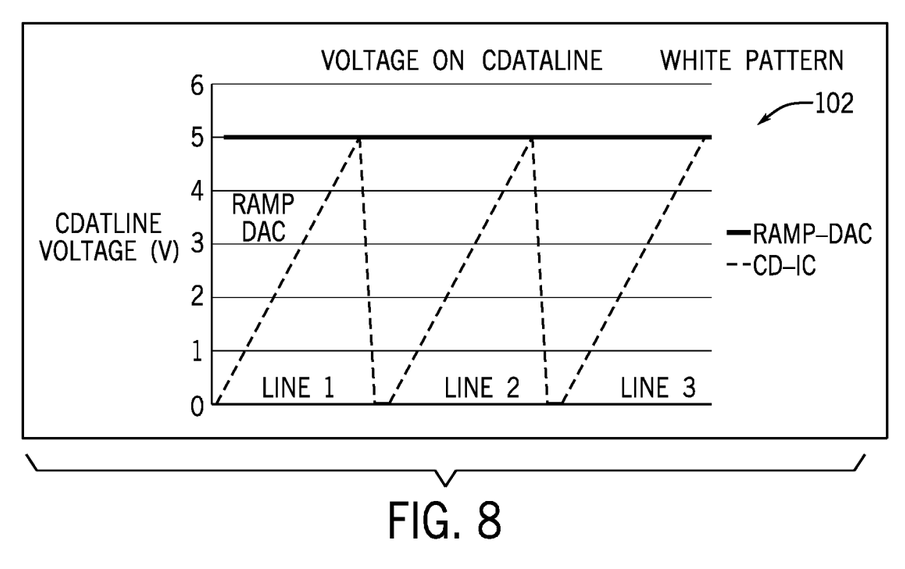
FIG. 8 is a graph of a voltage output provided by an example ramp digital-to-analog converter (DAC) circuit that may be used to drive the matrix of pixels of FIG. 7, in accordance with an embodiment.

With this in mind, to provide data voltages to pixels 62, the display driver IC 30 may employ the ramp DAC circuit 32 to supply an appropriate voltage to the pixels 62. That is, the ramp DAC circuit 32 may output a number of voltages according to a function. For example, FIG. 8 illustrates an example voltage output of the ramp DAC circuit 32. As shown in the graph 102 of FIG. 8, the voltage output by the ramp DAC circuit 32 increases linearly from 0V to 5V. After reaching 5V, the voltage output by the ramp DAC circuit 32 returns to 0V and linearly increases again in the same manner as the previous cycle.

Figure 9:
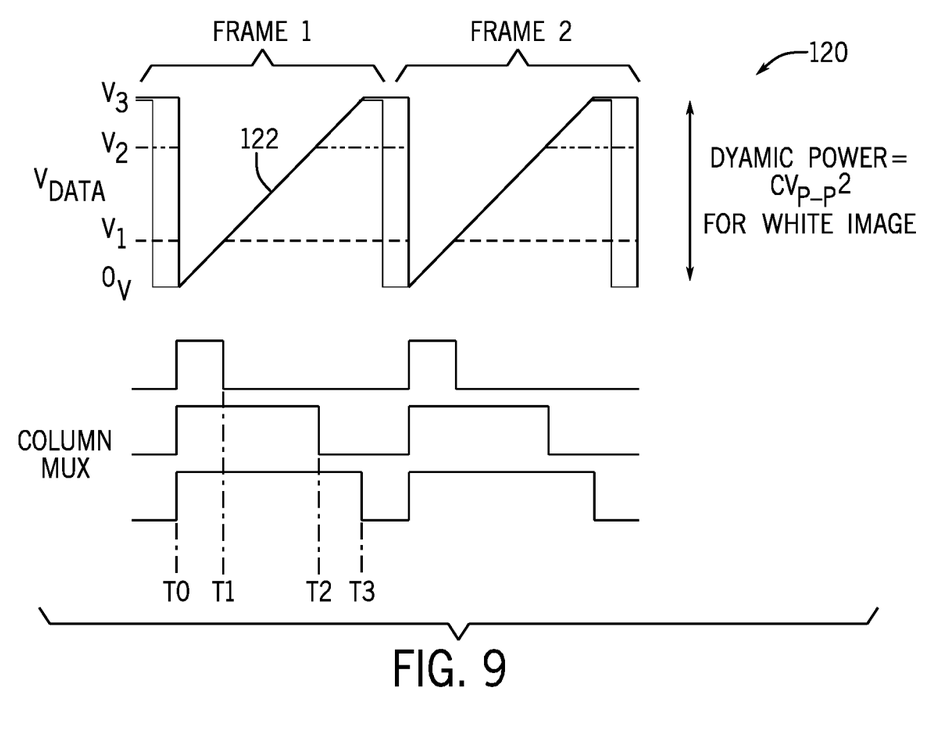
FIG. 9 is a circuit diagram that couples a ramp DAC voltage to data lines within the matrix of pixels of FIG. 7, in accordance with an embodiment.

In one embodiment, to supply a voltage to the pixels 62, the display driver IC 30 couple the voltage output of the ramp DAC circuit 32 to a corresponding data line 66, as depicted in the circuit diagram 110 of FIG. 9. Referring to FIG. 9, image data 92 may be received by the display driver IC 30 at a line buffer 112, which may store data voltage values for a line of pixels 62 of the display panel 60. Based on the data voltage values for a line of pixels 62, the display driver IC 30 may control when the ramp DAC circuit 32 is to be coupled to a corresponding data line 66. In certain embodiments, the display driver IC 30 may control the timing in which the ramp DAC circuit is coupled to a data line 66 using a circuit component, such as a multiplexer (MUX). As such, the display driver IC 30 may use a MUX to time when a switch 114 will be closed to couple the data line 66 to the ramp DAC circuit 32.

In addition to the listed components, the circuit diagram 110 may also include an analog-to-digital converter (ADC) circuit that may receive feedback regarding the voltage applied to the capacitor of a respective pixel circuit or pixel 62 via the respective data line 66. The feedback data received via the ADC may be used to improve data driving accuracy and reduce distances that may be caused by sharing a charge between multiple data lines 66.

Figure 10:
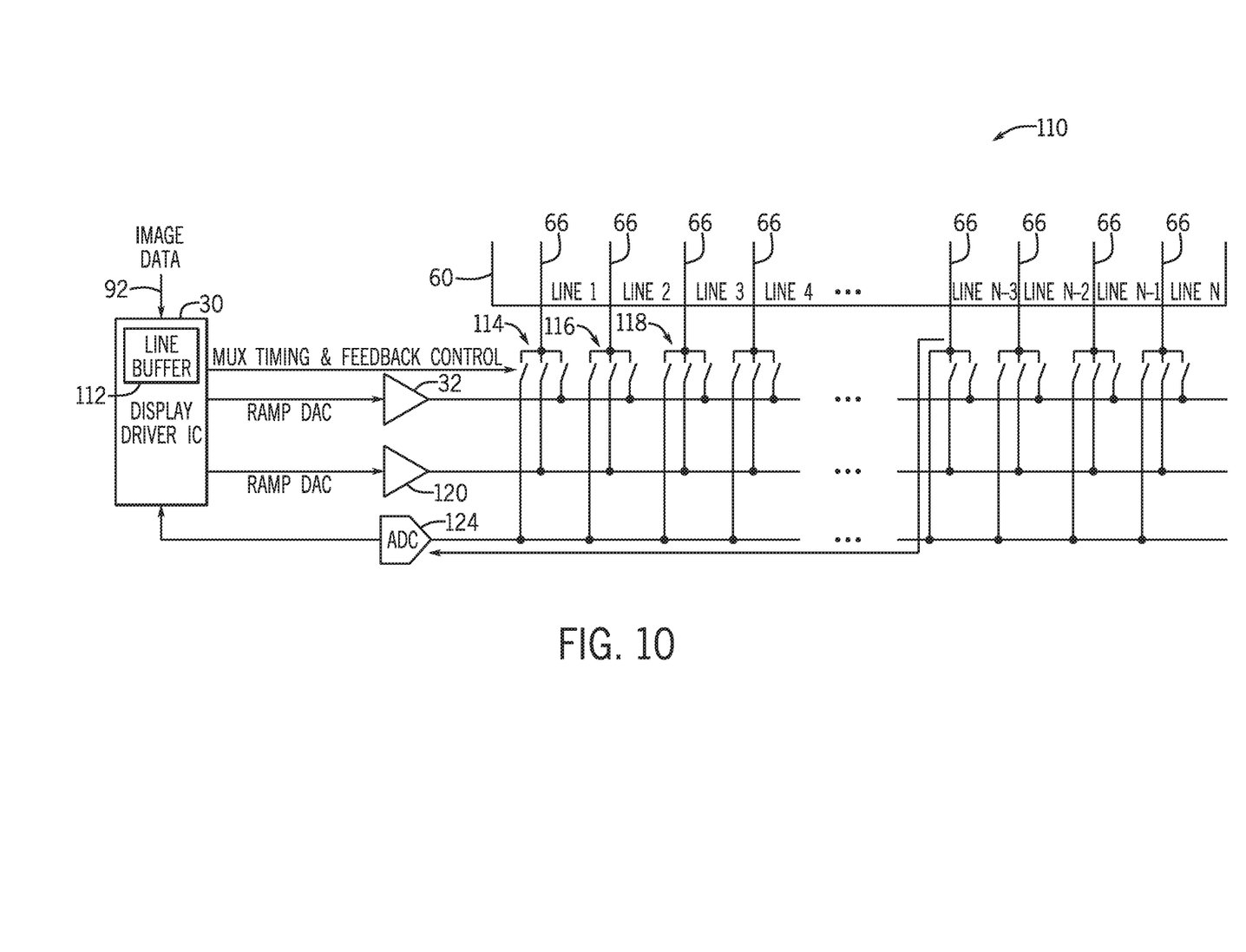
FIG. 10 is a timing diagram indicative of one embodiment in which a ramp DAC voltage is coupled to a respective pixel circuit, in accordance with an embodiment.

Referring now to the timing diagram 120 of FIG. 10, in one embodiment, the display driver IC 30 may cause a MUX controlling the operation of the switch 114 to send a signal to the switch 114 to close between time T0 and T1. The time period between time T0 and time T1 may correspond to when a ramp DAC voltage 122 increases from 0V to V1. As such, during the time T0 to T1 time period, a capacitor 70 of a pixel circuit associated with a respective pixel 62 coupled to a respective data line 66 may be charged to voltage V1, thereby providing a data voltage V1 to the respective pixel 62. In turn, the pixel 62 may depict a grey scale value that correspond to the data voltage V1.

In the same manner, the display driver IC 30 may control the operation of switches 116 and 118 and output respective data voltages using the same ramp DAC voltage 122 employed for data line 1 of the switch 114. That is, the display driver IC 30 may use the MUX to close the switch 116 between time T0 and time T2 to cause data line 2 to receive a portion of the ramp DAC voltage 122 between 0V and data voltage V2. Similarly, the display driver IC 30 may use the MUX to close the switch 118 between time T0 and time T3 to cause data line 3 to receive a portion of the ramp DAC voltage 122 between 0V and data voltage V3.

By using the MUX and the display driver IC 30 together with the switches 114, 116, and 118 (or any suitable number of switches), the electronic device 10 may use a single display driver IC 30 for multiple data lines 66. As a result, less area or space will be used to control the operation of the display 18. However, by continuously discharging a line capacitor 70 or a respective pixel circuit to 0V between each frame of image data, the electronic display may incur certain amounts of dynamic power losses when the image data remains unchanged between frames. That is, as shown in FIG. 10, when providing the same voltage V1 in subsequent frames of image data, a respective circuit component (e.g., capacitor 70) of a respective pixel circuit will be discharged from the target voltage V1 to 0V and charged again to the target voltage V1. This discharge and recharge of the pixel circuit inefficiently consumes dynamic power for displaying image data.

Figure 11:
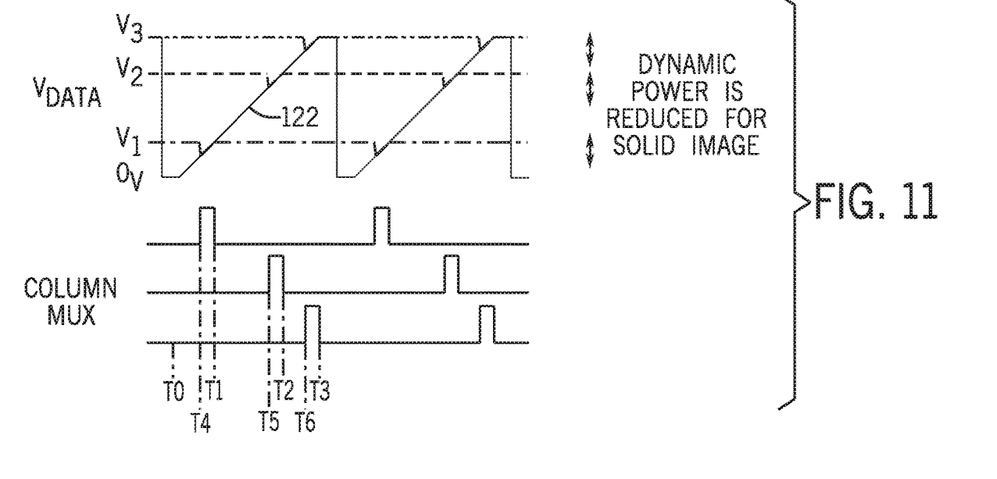
FIG. 11 is a timing diagram indicative of another embodiment in which a ramp DAC voltage is coupled to a respective pixel circuit, in accordance with an embodiment.

Keeping this in mind, FIG. 11 illustrates a timing diagram for controlling the MUX and reducing the dynamic power losses when providing data voltages to pixels 62. Referring to FIG. 11, instead of keeping the switch 114, for example, closed while the ramp DAC voltage 122 increases from zero to the target voltage V1 (e.g., time period T0-T1), the display driver IC 30 may control the MUX to couple the ramp DAC voltage 122 to a respective pixel circuit just before (e.g., 10 ns, within 1%) the ramp DAC voltage 122 reaches the target voltage V1. As shown in FIG. 11, the MUX switches on during the time interval between time T4 and time T1, as opposed to between time T0 and time T1 provided in FIG. 10. Moreover, when maintaining the same data voltage in a subsequent frame, the display driver IC 30 controls the MUX to again couple the ramp DAC voltage 122 to the respective pixel circuit for a similar duration of time (e.g., time between time T4 and time T1).

By employing the pixel driving scheme depicted in FIG. 11, the display driver IC 30 may couple the data line 66 to the ramp DAC circuit 32 for a significantly shorter amount of time as compared to the driving scheme represented by FIG. 10. With this in mind, the display driver IC 30 saves a significant amount of dynamic power by avoiding discharging and charging a capacitor 70 or other circuit component for each frame of image data. Indeed, for pixels that continuously depict a white color in continuous frames of image data, the pixel driving scheme presented in FIG. 11 may save up to 99% of the dynamic power previously consumed by the respective pixel circuits because the corresponding capacitor 70 would be coupled to the ramp DAC voltage 122 for the entire duration of the voltage curve, discharged from the highest output voltage to zero, and recharged again until the ramp DAC voltage 122 reached its peak again. This continuous cycle of charging and discharging of the capacitor 70 of the respective pixel circuit corresponds to an amount of dynamic power that may be saved by instead coupling the ramp DAC voltage 122 to the capacitor 70 just before the ramp DAC voltage 122 reaches the target voltage.

With the foregoing in mind, in certain embodiments, multiple ramp DAC circuits 32 may be employed by the display driver IC 30 to provide more dynamic power savings. For example, referring back to FIG. 9, a second ramp DAC circuit 120 may be employed by the display driver IC 30 to provide a second ramp DAC voltage output. In one embodiment, the second ramp DAC circuit 120 may output a voltage signal that is a mirror image of the voltage signal output by the ramp DAC circuit 32. By way of example, FIG. 12 illustrates a ramp DAC voltage signal 132 that may be output by the ramp DAC circuit 32 and a ramp DAC voltage signal 134 that may be output by the ramp DAC circuit 120.

Figure 12:
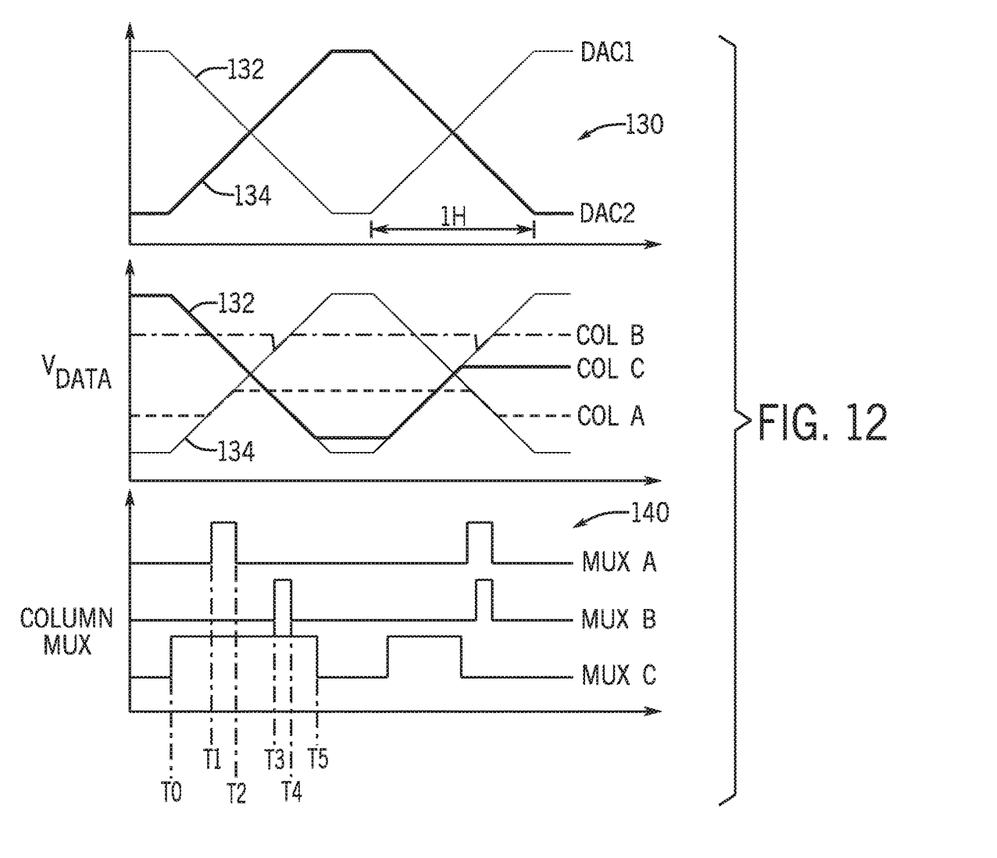
FIG. 12 is a collection of graphs that illustrate the voltage outputs of two ramp DAC circuits, the voltages applied to three pixel circuits, and timing signals for controlling when the two ramp DAC circuits are coupled to the three pixel circuits, in accordance with certain embodiments.

As shown in the graph 130 of FIG. 12, the ramp DAC voltage 132 may decrease as the ramp DAC voltage 134 increases. By providing two mirror voltage signals, the display driver IC 30 may have more flexibility in determining when to couple a data line 66 to a particular ramp DAC circuit based on the amount of dynamic power associated with the data voltage change between frames of image data. That is, the amount of dynamic power consumed between frames of image data may be based on an amount of voltage change between the data voltages provided to the same pixel 62 in two adjacent frames of image data. As such, to reduce the amount of dynamic power losses incurred by the electronic device 10, the display driver IC 30 may determine which of the two ramp DAC circuit 32 or 120 to couple to the respective data line 66 when changing the data voltage being applied to the respective pixel circuit, such that the selected ramp DAC circuit causes the electronic device 10 to incur the lower amount of dynamic power losses.

To better illustrate the dynamic power savings provided by using at least two ramp DAC circuits, FIG. 12 illustrates a driving scheme that the display driver IC 30 may employ when changing the data voltage applied to two pixels 62 and maintain the same data voltage applied to a third pixel 62 between two frames of image data. Referring first to the timing diagram 140 of FIG. 12, pixel A may change from voltage V1 to voltage V2 between two frames of image data. When determining which ramp DAC voltage signal 132 or 134 to use to increase the data voltage applied to pixel A, the display driver IC 30 may use the ramp DAC voltage signal that has a positive slope or increases between the frames of image data. As such, the display driver IC 30 may control a MUX A to switch on between time T1 and time T2, such that the MUX A couples the ramp DAC voltage signal 134 to the pixel A between time T1 and time T2.

In the same manner, when decreasing the data voltage applied to pixel C, the display driver IC 30 may control a MUX C to switch on between time T0 and time T5, such that the MUX C couples the ramp DAC voltage signal 132 to the pixel C between time T0 and time T5, thereby changing the data voltage applied to the pixel C. In addition, when the data voltage does not change between frames of image data, as depicted for pixel B, the display driver IC 30 may control MUX B to switch on and couple the pixel B for a short duration of time (e.g., between time T3 and time T4) to ensure that the respective capacitor 70 for pixel B maintains the same data voltage.

Although the foregoing description of the driving scheme employed by the display driver IC 30 is described as being performed using two ramp DAC circuits 32 and 120, it should be noted that the display driver IC 30 may use any suitable number of ramp DAC circuits and is not limited to embodiments that use one or two ramp DAC circuits. Moreover, for each ramp DAC circuit used to provide a ramp DAC voltage signal to a data line 66, a corresponding circuit component (e.g., MUX) may be employed to couple the respective output of the ramp DAC circuit to the respective data line 66.

Figure 13:
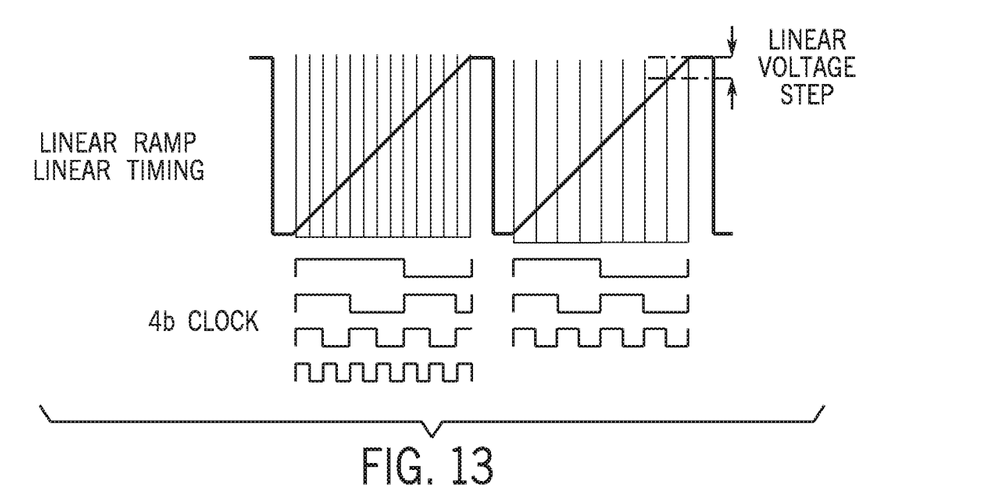
FIG. 13 is a graph of an example linear voltage output curve for a ramp DAC circuit along with a collection of linearly timed clock signals associated with the ramp DAC circuit output, in accordance with an embodiment.

In certain embodiments, the ramp DAC circuits 32 or 120 may be controlled by an N-bit clock that ramps the voltage level of the ramp DAC voltage signal. For instance, FIG. 13 illustrates an example linear ramp DAC voltage that is associated with a linearly timed (e.g., equally spaced) 4-bit clock. When using a 4-bit clock to control the output of the ramp DAC circuit 32, the display driver IC 30 may wait for the 4-bit clock to toggle a sufficient amount of time until the target voltage is reached by the output voltage. By reducing the amount of toggling of the 4-bit clock, the display driver IC 30 may provide additional power savings for the electronic display.

Figure 14:
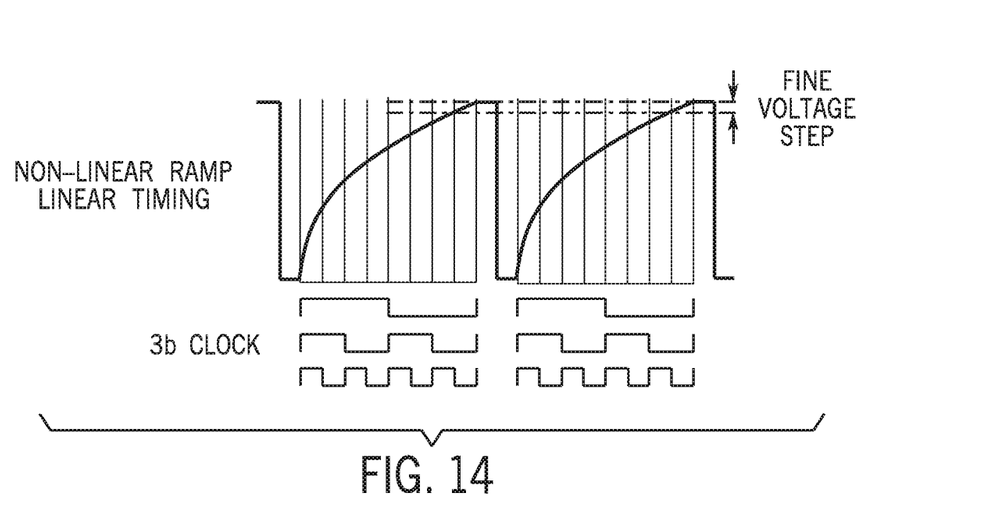
FIG. 14 is a graph of an example non-linear voltage output curve for a ramp DAC circuit along with a collection of non-linearly timed clock signals associated with the ramp DAC circuit output, in accordance with an embodiment.

With this in mind, a lower frequency clock may be used by the display driver IC 30 to control the output of the ramp DAC circuit 32. For example, as illustrated in FIG. 14, a 3-bit clock may be used in combination with a non-linear voltage ramp output by the ramp DAC circuit 32. That is, the ramp DAC circuit 32 may output a non-linear voltage curve that has a lower slope towards the end of the non-linear voltage output, as compared to the initial portion of the non-linear voltage output. Generally, the differences between brightness levels or gray levels depicted by a pixel 62 at lower voltages are less discernable as compared to the differences between gray levels at higher voltages. As such, the display driver IC 30 may use a lower frequency clock (e.g., 3-bit) to select voltage levels via the non-linear voltage signal output by the ramp DAC circuit 32, while maintaining the quality of the data voltage provided to the respective pixel 62. That is, as shown in FIG. 14, the clock cycles that correspond with the later portion of the non-linear voltage output may provide for fine voltage steps using the 3-bit clock at the higher spectrum of voltages, where the corresponding gray levels may be more susceptible to being depicted by the pixel 62 inaccurately. As a result, a lower frequency clock may be used to depict image data, thereby providing for improved power savings and less area within the display 18 or the electronic device 10 used by clock circuits.

Figure 15:
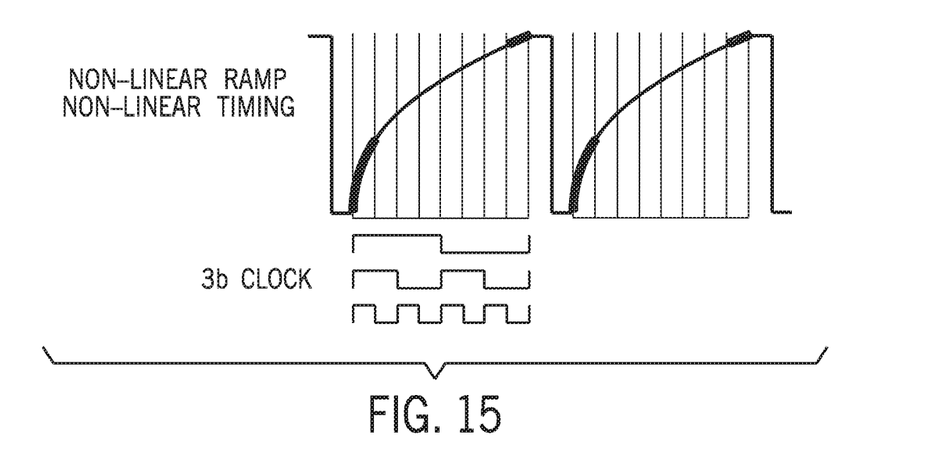
FIG. 15 is a graph of an example non-linear voltage output curve for a ramp DAC circuit along with a collection of linearly timed clock signals associated with the ramp DAC circuit output, in accordance with an embodiment.
Figure 16:
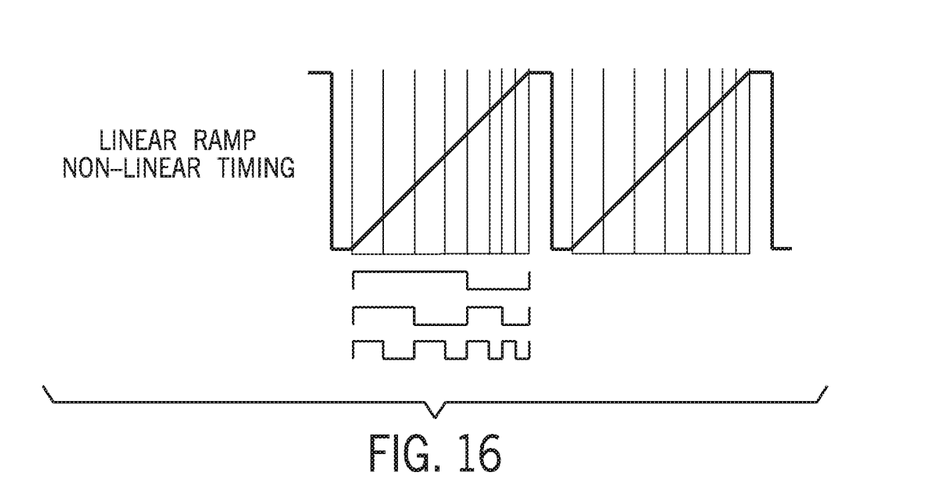
FIG. 16 is a graph of an example linear voltage output curve for a ramp DAC circuit along with a collection of non-linearly timed clock signals associated with the ramp DAC circuit output, in accordance with an embodiment.

In addition to employing a non-linear voltage signal, the display driver IC 30 may provide additional tuning for the higher spectrum voltage by using a non-linear clock circuit. That is, as shown in FIG. 15, the display driver IC 30 may employ a clock that outputs clock cycles non-linearly such that the clock toggles more frequently towards the end of the ramp DAC voltage signal. In this way, the display driver IC 30 may again leverage the minor visual effects between gray levels that correspond to lower voltage values to use larger spaced clock cycles towards the beginning of the ramp DAC voltage output. Moreover, to provide more fine tuning of voltages at the higher spectrum of the ramp DAC voltage output, the clock employed by the display driver IC 30 may toggle more frequently towards the end of the ramp DAC voltage output. It should be noted that the non-linear timed clocks may also be employed for ramp DAC circuits 32 that output a linear ramp DAC voltage signal, as provided in FIG. 16, for the same reasons provided above.

In sum, the non-linear timing control may provide for improved voltage precision with regard to the nature of the display 18 or gamma properties associated with the display 18. Moreover, the non-linear timing control reduces the number of clock lines provided to the display driver IC 30 and thus reduced the area that the clocks use within the display driver IC 30 and the like. Additionally, the use of lower frequency clocks provides power savings in fewer toggles by the clock circuit.

In some instances, when changing data voltages between frames of image data, it may be useful to provide the target voltage to the respective capacitor 70 of the respective pixel circuit for a certain amount of time to allow for the applied voltage to settle. By extending the amount of time in which the target voltage is applied to the respective capacitor 70, the display driver IC 30 may reduce or distribute the effects of a voltage kickback that may be output by the respective capacitor 70 when the ramp DAC voltage is initially coupled to the data line 66.

To allow for increased settling time to apply a target voltage to a respective pixel circuit, the display driver IC 30 may receive image data, identify data values that may be benefited by increased settling times, and adjust a slew rate of the ramp DAC voltage signal output by the ramp DAC circuit 32 to provide for an increased amount of time in which the target voltage is applied to the respective capacitor 70.

Figure 17:
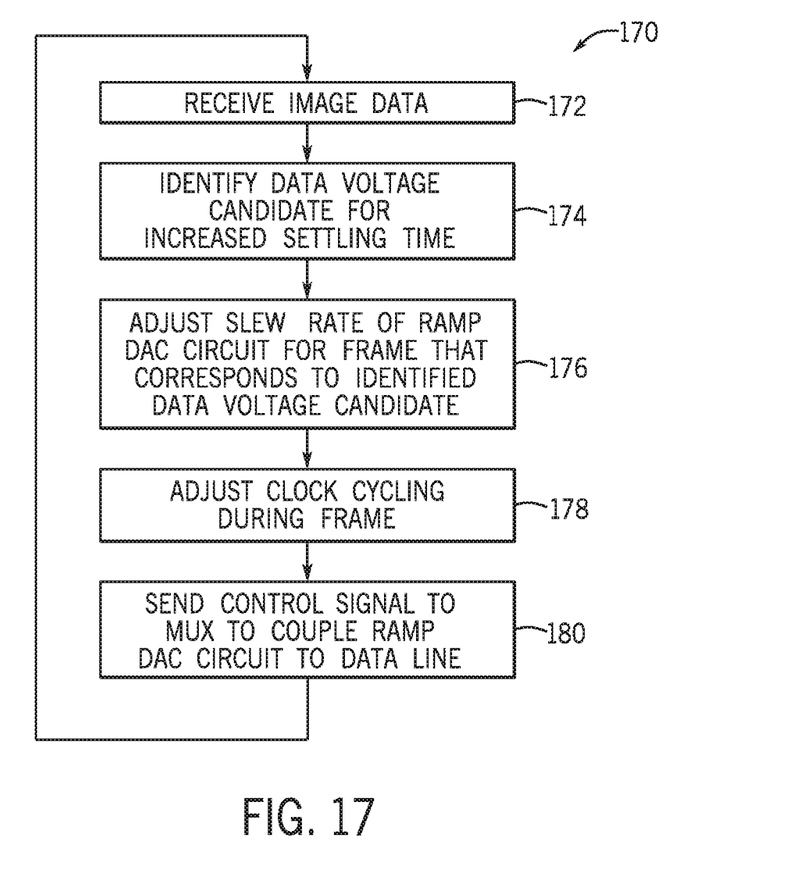
FIG. 17 is a flow diagram of a method for controlling the output of the ramp DAC circuit to the matrix of pixels of FIG. 7, in accordance with an embodiment.

With the foregoing in mind, FIG. 17 illustrates a flow chart of a method 170 for controlling a ramp DAC voltage signal when providing data voltages to pixels 62. Although the following description of the method 170 is described as being performed by the display driver IC 30, it should be noted that, in some embodiments, the method 170 may be performed by any suitable processing device. In addition, although the method 170 is described in particular order, it should be understood that the method 170 may be performed in any suitable order.

Referring now to FIG. 17, at block 172, the display driver IC 30 may receive image data that includes gray level data for each pixel 62 of the display panel 60 in multiple frames of image data. After receiving the image data, the display driver IC 30 may identify data voltage candidates that may benefit from an increased amount of time for being coupled to the respective pixel 62 to provide for more time for the target voltage to settle within the respective capacitor 70. In some embodiments, the identified data voltage candidates may corresponds to the data voltages that are associated with changes in voltage from an adjacent frame that is greater than some threshold of voltage. That is, a difference in gray levels between two frames of image data for a particular pixel 62 is greater than some threshold value, the display driver IC 30 may identify the later data voltage as a data voltage candidate that may benefit from a longer settling time to provide enough time for the respective capacitor 70 of the pixel 62 to charge to the target voltage vale.

At block 176, the display driver IC 30 may adjust a slew rate of the ramp DAC circuit 32 for the frame of image data that corresponds to the identified data voltage candidate. In one embodiment, the slew rate may be adjusted to cause the voltage ramp signal to increase more quickly to provide an amount of time during the middle of the frame of image data to allow for the target voltage to be coupled to the respective pixel.

At block 178, the display driver IC 30 may adjust the cycling or toggling of the clock associated with the ramp DAC circuit 32 to pause its cycling when the target voltage of the data voltage candidate is reached. At block 180, the display driver IC 30 may send a signal to a circuit component, such as the MUX, to couple the ramp DAC circuit 32 to the respective pixel 62 during the same time interval in which the clock cycling has been suspended. As such, the display driver IC 30 may couple the respective capacitor 70 of the pixel circuit to the target voltage for an extended amount of time, as compared to the embodiments described above.

After the MUX disconnects the ramp DAC circuit 32 from the respective data line 66, the display driver IC 30 may resume the clock cycling for the slew rate-adjusted ramp DAC circuit 32, such that the ramp DAC voltage completes its cycle. The display driver IC 30 may then return to block 172 and continuously repeat the method 170 for the received image data.

Figure 18:
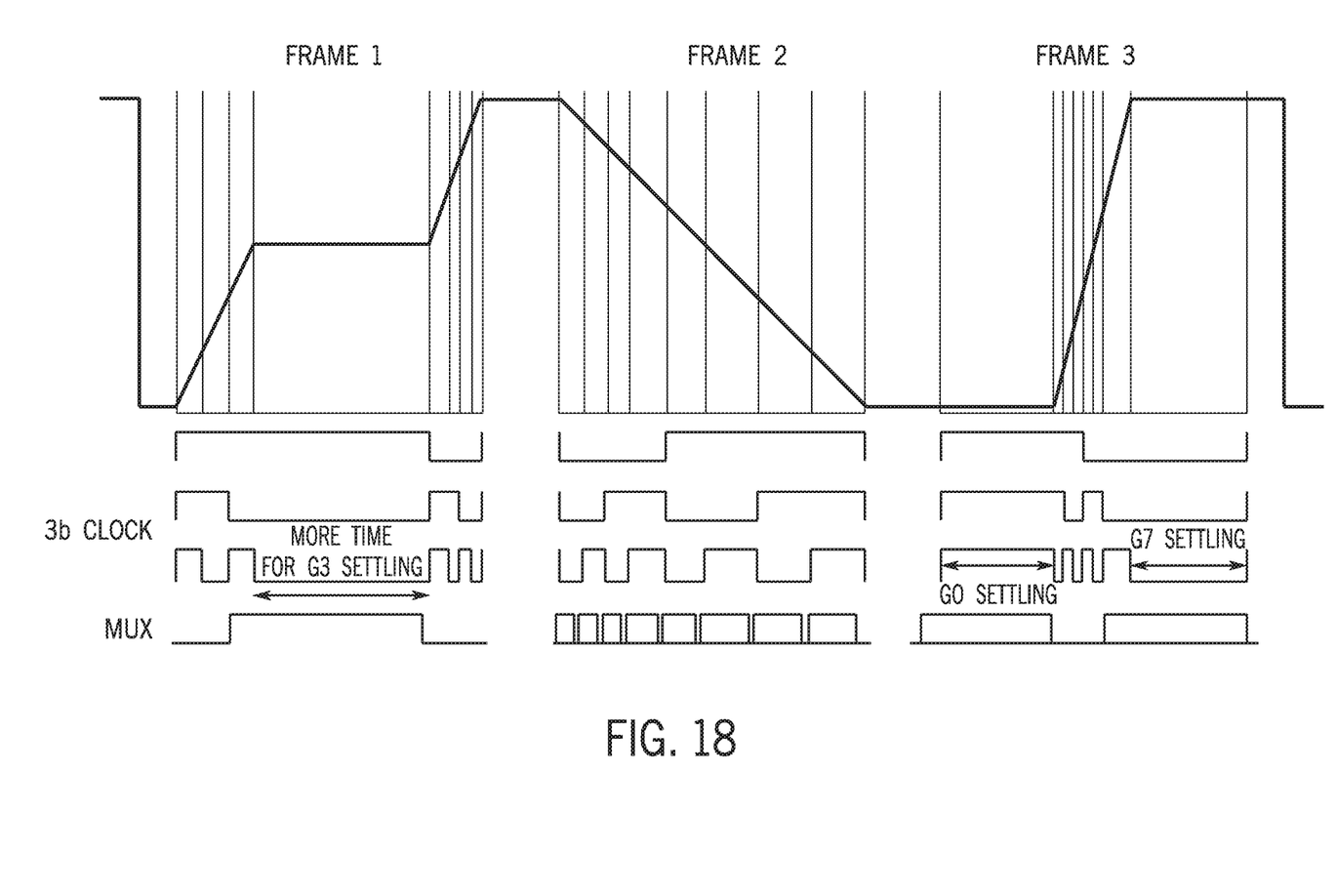
FIG. 18 illustrates a timing diagram for controlling the coupling of the ramp DAC circuit to a pixel circuit, in accordance with certain embodiments.

By way of reference, FIG. 18 illustrates an example timing diagram 190 in which the display driver IC 30 may control the clock cycling and the MUX output to provide an extended amount of time for a respective pixel 62 to receive a gray level 3 voltage. After the first frame of image data for the respective pixel 62, the display driver IC 30 may adjust the slew rate of the ramp DAC voltage signal to decrease in a linear fashion using a non-linear timing scheme for its clock. During this second frame of image data, the display driver IC 30 may also control the MUX to cause the respective capacitor 70 of the pixel circuit to discharge to zero. After discharging the pixel 62 to zero voltage, the display driver IC 30 may provide a zero gray level to the respective pixel for half of the third frame of image data, adjust the slew rate to increase rapidly from zero to its peak voltage in the middle of the third frame, and couple the peak voltage of the ramp DAC voltage signal to the pixel 62 for the remaining portion of the third frame of image data. As shown in the timing diagram 190, the MUX is switched on for a first portion and an end portion of the third frame of image data and the clock cycles are concentrated in the middle of the third frame to cause the slew rate to increase.

It should be noted that the ability of the display driver IC 30 to intelligently identify data voltages to provide extended time for settling may be useful when using multiple ramp DAC circuits 32 for a display 18. That is, based on the image data and the available ramp DAC circuits, the display driver IC 30 may determine whether a data voltage will be coupled to a respective pixel for a sufficient amount of time to adequately charge a respective capacitor 70 or avoid kickbacks or other unwanted electrical effects due to the use of a ramp DAC voltage signal. In any case, the use of the multiple ramp DAC circuits 32 and/or the intelligent data line MUX control described above with reference to FIGS. 8-18 may be used to reduce dynamic power consumption, reducing digital clocking power, and improve data accuracy of the image data depicted on the display 18.

In addition, in some embodiments, the method 170 may include receiving feedback data from the ADC circuit 124 to verify whether the data provided to the respective pixel 62 corresponds to the target data specified by the data voltage. The display driver IC 30 may use the feedback data to calibrate the timing of the MUX signals and clock cycling to provide an accurate target voltage to the respective pixel 62 based on the feedback data.

It should be noted that in certain embodiments, one display driver IC 30 with multiple ramp DAC circuits 32 may be employed to drive one display 18. However, in other embodiments, one display driver IC 30 with multiple ramp DAC circuits 32 may be employed to drive a portion of the display 18. As such, different display driver ICs 30 may control the operation of different portions of the display 18 to provide for reduced computing power and more efficient distribution of data voltages across the display 18.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A display device, comprising:
   a plurality of rows of pixels configured to display image data on a display;
   a plurality of data lines coupled to the plurality of rows of pixels;
   a digital-to-analog converter (DAC) configured to output a ramp voltage signal comprising a data voltage to be depicted on a first pixel of the plurality of rows of pixels, wherein the data voltage corresponds to image data representative of an image to be displayed by the plurality of rows of pixels, wherein the image data comprises a plurality of data voltages associated with a plurality of pixels of the plurality of rows of pixels, and wherein the ramp voltage signal corresponds to a plurality of voltages output by the DAC over a period of time according to a linear function; and
   a capacitor configured to receive the ramp voltage signal via the DAC, wherein the capacitor is associated with the first pixel; and
   a circuit configured to send a control signal to a circuit component for a duration of time based on the data voltage, wherein the circuit component is configured to cause the DAC to couple to the capacitor via one of the plurality of data lines for the duration of time that corresponds to a portion of the period of time that is less than the period of time based on the data voltage, wherein the duration of time starts at a first time when the ramp voltage signal is below the data voltage and within a threshold percentage of the data voltage and ends at a second time in response to the ramp voltage signal reaching the data voltage, wherein the capacitor is coupled to the DAC when the ramp voltage signal is greater than zero, wherein the DAC is decoupled from the capacitor during a remainder of the period of time, the remainder corresponding to a second portion of the period of time that is less than the period of time, and wherein the period of time corresponds to a frame of image data.

2. The display device of claim 1, comprising a switch configured to couple the DAC to the one of the plurality of data lines based on the control signal provided to the circuit component.

3. The display device of claim 1, wherein the circuit component comprises a multiplexer.

4. The display device of claim 1, comprising a second DAC configured to output a second ramp voltage signal that mirrors the ramp voltage signal.

5. The display device of claim 4, wherein the second DAC is coupled to the one of the plurality of data lines and the circuit component.

6. The display device of claim 5, wherein the control signal is configured to cause the circuit component to couple the DAC or the second DAC to the one of the plurality of data lines based on the data voltage as compared to a voltage that corresponds to a previous frame of image data.

7. The display device of claim 1, comprising an analog-to-digital converter (ADC) configured to detect a voltage charge of the capacitor via the one of the plurality of data lines.

8. The display device of claim 7, wherein the circuit is configured to receive the voltage charge via the ADC.

9. A display driver circuit, comprising a processor configured to:
- receive image data to be displayed by a plurality of pixels in a display, wherein the image data comprises a plurality of data voltages for the plurality of pixels over a plurality of frames;
- identify at least one of the plurality of data voltages to supply to a pixel circuit associated with one of the plurality of pixels for a period of time during one of the plurality of frames based on the image data;
- adjust a slew rate of a ramp digital-to-analog converter (DAC) voltage signal output by a ramp DAC circuit based on the at least one of the plurality of data voltages, wherein the ramp DAC circuit is configured to couple to the pixel circuit via a data line of the display, and wherein the ramp DAC voltage signal output by the ramp DAC circuit corresponds to a second plurality of voltages output over a period of time according to a linear function; and
- send a control signal to a multiplexer configured to cause the ramp DAC circuit to couple to the pixel circuit for a portion of the period of time that is less than the period of time during the one of the plurality of frames, wherein the ramp DAC circuit is decoupled from the pixel circuit during a remainder of the period of time, the remainder corresponding to a second portion of the period of time that is less than the period of time, and wherein the period of time corresponds to a frame of image data.

10. The display driver circuit of claim 9, wherein the processor is configured to adjust a clock cycling of a clock configured to control an output of the DAC circuit.

11. The display driver circuit of claim 10, wherein the clock cycling is non-linearly timed.

12. The display driver circuit of claim 9, wherein the ramp DAC circuit is coupled to at least two data lines of the display.

13. An electronic device, comprising:
- a plurality of data lines configured to couple to a plurality of pixel circuits;
- a plurality of ramp digital-to-analog converter (DAC) circuits configured to output a plurality of ramp DAC voltage signals, wherein each of the plurality of ramp DAC voltage signals corresponds to a plurality of voltages output by a corresponding ramp DAC circuit over a period of time according to a linear function;
- a switch device configured to couple a respective one of the plurality of data lines to the plurality of DAC circuits; and
- a display driver circuit configured to control an operation of the switch device to couple one of the plurality of ramp DAC circuits to the respective one of the plurality of data lines for a portion of the period of time that is less than the period of time based on image data to be displayed by a plurality of pixels coupled to the plurality of pixel circuits, wherein the one of the plurality of ramp DAC circuits is decoupled from the respective one of the plurality of data lines during a remainder of the period of time, the remainder corresponding to a second portion of the period of time that is less than the period of time, and wherein the period of time corresponds to a frame of image data.

14. The electronic device of claim 13, comprising a multiplexer configured to control the operation of the switch device based on a control signal received via the display driver circuit.

15. The electronic device of claim 13, comprising a clock configured to control an output of the one of the plurality of ramp DAC circuits.

16. The electronic device of claim 15 wherein the clock is non-linearly timed.

* * * * *